(12) United States Patent
Adachi et al.

(10) Patent No.: US 7,317,159 B2
(45) Date of Patent: Jan. 8, 2008

(54) THERMOELECTRIC CONVERSION ELEMENT AND METHOD OF MANUFACTURING THE SAME, AND THERMOELECTRIC CONVERSION DEVICE USING THE ELEMENT

(75) Inventors: Hideaki Adachi, Osaka (JP); Satoshi Yotsuhashi, Hyogo (JP); Yasunari Sugita, Osaka (JP); Tsutomu Kanno, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 319 days.

(21) Appl. No.: 11/194,698

(22) Filed: Aug. 2, 2005

(65) Prior Publication Data

US 2006/0107990 A1 May 25, 2006

Related U.S. Application Data

(63) Continuation of application No. PCT/JP2005/000519, filed on Jan. 18, 2005.

(30) Foreign Application Priority Data

Jan. 19, 2004 (JP) .............................. 2004-010090

(51) Int. Cl.
*H01L 35/32* (2006.01)

(52) U.S. Cl. .................... 136/211; 136/203; 136/205

(58) Field of Classification Search ............... 136/203, 136/205, 211
See application file for complete search history.

(56) References Cited

U.S. PATENT DOCUMENTS

2005/0139250 A1* 6/2005 DeSteese et al. ........... 136/212

FOREIGN PATENT DOCUMENTS

| JP | 6-029581 | 2/1994 |
|---|---|---|
| JP | 8-094451 | 4/1996 |
| JP | 8-195509 | 7/1996 |
| JP | 2001-185768 | 7/2001 |
| JP | 2002-335021 | 11/2002 |

* cited by examiner

*Primary Examiner*—Nam Nguyen
*Assistant Examiner*—Anthony Fick
(74) *Attorney, Agent, or Firm*—McDermott Will & Emery LLP (57) ABSTRACT

The present invention provides a thermoelectric conversion element that has high efficiency even at reduced thickness. In this thermoelectric conversion element, striped p-type thermoelectric conversion parts are arranged on one surface of an insulating layer, and striped n-type thermoelectric conversion parts are arranged on the other surface. The two sets of stripes form overlapped portions. At one or more of the overlapped portions, a first p-type thermoelectric conversion part and a first n-type thermoelectric conversion part are electrically connected via a first conducting portion arranged within the insulating layer, a second p-type thermoelectric conversion part and a second n-type thermoelectric conversion part are electrically connected via a second conducting portion arranged within the insulating layer, and the first conducting portion and the second conducting portion are electrically isolated. The element of the present invention provides two junctions in a region where a conventional element would provide only one junction.

27 Claims, 11 Drawing Sheets

THERMOELECTRIC CONVERSION ELEMENT AND METHOD OF MANUFACTURING THE SAME, AND THERMOELECTRIC CONVERSION DEVICE USING THE ELEMENT

REFERENCE TO RELATED APPLICATION

This Application is a continuation of International Application No. PCT/JP2005/000519, whose international filing date is Jan. 18, 2005, which in turn claims the benefit of Japanese Application No. 2004-010090 filed on Jan. 19, 2004, the disclosures of which Applications are incorporated by reference herein. The benefit of the filing and priority dates of the International and Japanese Applications is respectfully requested.

BACKGROUND OF THE INVENTION

1. Field of the Invention

The present invention relates to a thermoelectric conversion element that performs conversion between thermal energy and electric energy by the Peltier effect or the Seebeck effect. The invention also relates to a thermoelectric conversion device using the element.

2. Description of the Related Art

A thermoelectric conversion element includes junctions that alternately connect a p-type thermoelectric conversion material, which has positive charge carriers, and an n-type thermoelectric conversion material, which has negative charge carriers. It performs cooling by the temperature difference between the junctions caused by electric current, or generates an electromotive force by the temperature difference between the junctions. In the thermoelectric conversion element, it is necessary that a high-temperature junction and a low-temperature junction be arranged spaced apart from each other.

Figure 17:
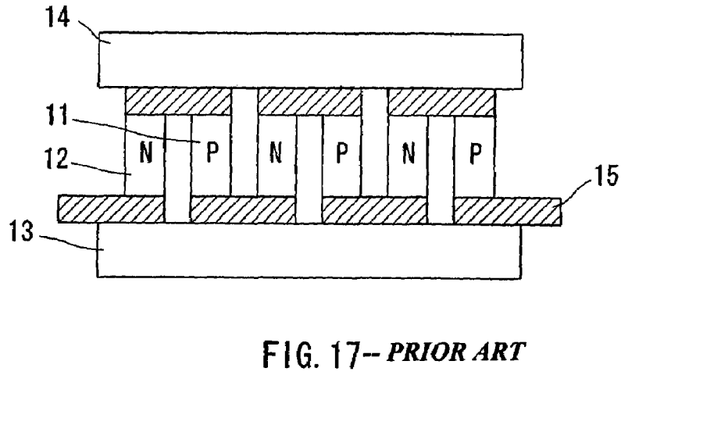
FIG. 17 is a cross-sectional view illustrating a conventional thermoelectric conversion element.

Conventionally, a thermoelectric conversion element is, as illustrated in FIG. 17, formed by connecting p-type thermoelectric units 11 and n-type thermoelectric units 12 alternately via inner electrodes 15. The p-type thermoelectric units 11 and n-type thermoelectric units 12 are made of a sintered compact, a molten-solidified substance, a single crystal, or the like of a semiconductor or an oxide material. Each of the inner electrodes 15 becomes either a high-temperature junction or a low-temperature junction alternately, and they are arranged so that the high-temperature junctions are in contact with a high-temperature heat bath portion 13 while the low-temperature junctions are in contact with a low-temperature-side heat bath portion 14. However, as long as a formed solid substance of a sintered compact or the like is used as a thermoelectric substance, it is difficult to reduce the thickness of the element and, moreover, it is impossible to allow the element to have flexibility.

Figure 18:
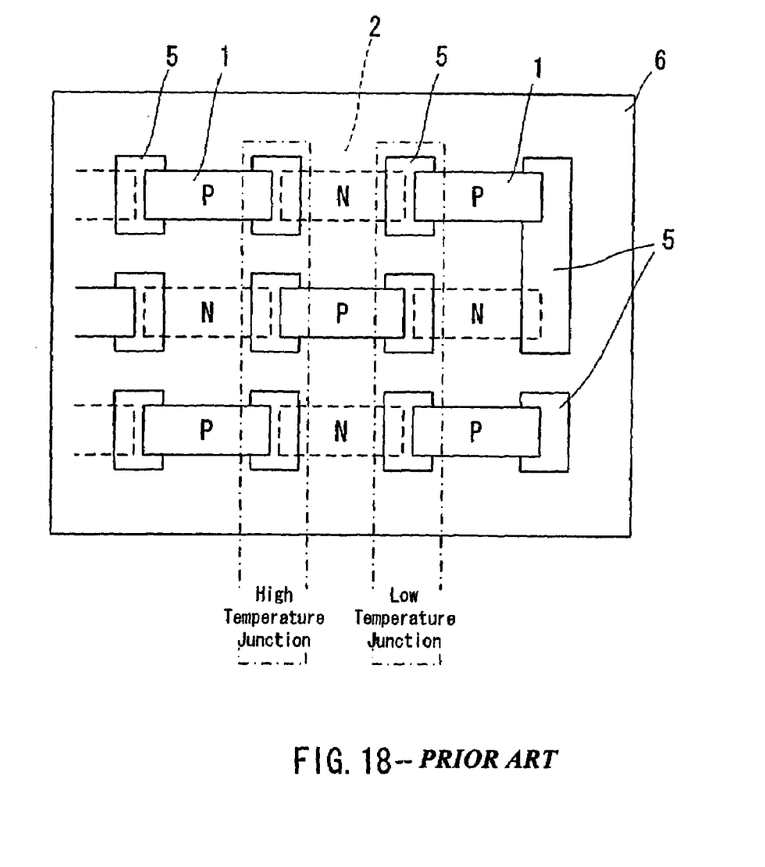
FIG. 18 is a plan view illustrating a conventional thin film-type thermoelectric conversion element.

JP 6-29581A discloses a thermoelectric conversion element employing a thin film material. In this element, as illustrated in FIG. 18, p-type thermoelectric conversion parts 1 formed on one surface of an insulating layer (substrate) 6 and n-type thermoelectric conversion parts 2 formed on the other surface thereof (the back surface in the figure) are connected via inner electrodes 5 buried in the insulating layer. In this element, for thickness reduction, the high-temperature junctions and the low-temperature junctions are arranged spaced apart with respect to an in-plane direction, not with respect to a film thickness direction.

Another thermoelectric conversion element having a similar form of connections is disclosed in FIG. 5 of JP 2002-335021A. In addition, JP 8-195509A discloses an improvement in the structure of a thermoelectric conversion device for reducing heat loss.

SUMMARY OF THE INVENTION

The thermoelectric conversion element shown in FIG. 18 has a limitation in the number of junctions that can be arranged per unit area, making an increase in efficiency difficult, since it is necessary to arrange the high-temperature junctions and the low-temperature junctions so as to be spaced apart with respect to an in-plane direction of the element. In addition, in the manufacture, a p-type thermoelectric conversion material film and an n-type thermoelectric conversion material film must be patterned into respective small pieces in the film formation. This has necessitated a complicated manufacturing process.

The thermoelectric conversion element shown in FIG. 18 is such that the conventional type of design (FIG. 17) is applied to a thin film-type element so that a unit junction (—p-type thermoelectric conversion part—inner electrode—n-type thermoelectric conversion part—inner electrode—) is arranged to shape a single stripe. In contrast, the present invention employs a new design suitable for thin film-type elements, wherein p-type thermoelectric conversion parts and n-type thermoelectric conversion parts are arranged so as to shape stripes that intersect with each other.

A thermoelectric conversion element according to the present invention includes: an insulating layer, striped p-type thermoelectric conversion parts arranged on a first surface of the insulating layer, and striped n-type thermoelectric conversion parts arranged on a second surface of the insulating layer; and has overlapping portions at which the striped p-type thermoelectric conversion parts and the striped n-type thermoelectric conversion parts intersect when viewed along a thickness direction of the insulating layer.

The thermoelectric conversion element of the present invention satisfies the following conditions a) through e) at one or more of the overlapping portions.

a) A first p-type thermoelectric conversion part of the p-type thermoelectric conversion parts and a first n-type thermoelectric conversion part of the n-type thermoelectric conversion parts are electrically connected via a first conducting portion arranged within the insulating layer.

b) A second p-type thermoelectric conversion part of the p-type thermoelectric conversion parts and a second n-type thermoelectric conversion part of the n-type thermoelectric conversion parts are electrically connected via a second conducting portion arranged within the insulating layer.

c) The first p-type thermoelectric conversion part and the second p-type thermoelectric conversion part are adjacent to each other with the overlapping portion interposed therebetween and are cut apart from each other in the overlapping portion;

d) The first n-type thermoelectric conversion part and the second n-type thermoelectric conversion part are to each other with the overlapping portion interposed therebetween and cut apart from each other in the overlapping portion.

e) The first conducting portion and the second conducting portion are electrically isolated.

In addition, the present invention provides a thermoelectric conversion device including the above-described thermoelectric conversion element and a heat conducting member being thermally in contact with a portion of the overlapping portions in the first surface or in the second surface.

A manufacturing method of a thermoelectric conversion element according to the present invention includes: a first step of producing a layered material in which p-type stripes composed of a p-type thermoelectric conversion material, an insulating layer, and n-type stripes composed of an n-type thermoelectric conversion material are arranged in that order when viewed along a thickness direction of the insulating layer; the p-type stripes and the n-type stripes intersect with each other to form overlapping portions; and the p-type stripes and the n-type stripes are electrically connected at the overlapping portions via conducting portions provided within the insulating layer; and a second step of forming p-type thermoelectric conversion parts and n-type thermoelectric conversion parts by cutting apart the p-type stripes and the n-type stripes.

The second step is a step of cutting apart the p-type stripes and the n-type stripes so that they satisfy the following conditions f) through i) at one or more of the overlapping portions.

f) A first p-type thermoelectric conversion part and a second p-type thermoelectric conversion part that are cut apart from each other are formed from the p-type stripes.

g) A first n-type thermoelectric conversion part and a second n-type thermoelectric conversion part that are cut apart from each other are formed from the n-type stripes.

h) The first p-type thermoelectric conversion part and the first n-type thermoelectric conversion part are electrically connected via a first conducting portion that is arranged within the insulating layer as one of the conducting portions; and i) The second p-type thermoelectric conversion part and the second n-type thermoelectric conversion part are electrically connected via a second conducting portion that is arranged within the insulating layer as one of the conducting portions and is electrically isolated from the first conducting portion.

In the present invention, the p-type thermoelectric conversion parts and the n-type thermoelectric conversion parts are arranged so as to shape striped patterns that intersect with each other, and two junctions electrically isolated from each other are formed in one of more of the overlapping portions at which the stripes intersect. This achieves a greater number of junctions that can be arranged per unit area and a higher efficiency of the thermoelectric conversion element than the conventional elements. Moreover, according to the manufacturing method of the present invention, a thermoelectric conversion element with high efficiency can be attained without necessitating complicated patterning.

BRIEF DESCRIPTION OF THE DRAWINGS

FIGS. 14A to 14E show views illustrating a thermoelectric conversion element fabricated according to Example 1.

FIGS. 15A to 15D show views illustrating a thermoelectric conversion element fabricated according to Example 2.

DESCRIPTION OF THE PREFERRED EMBODIMENTS

Hereinbelow, preferred embodiments of the present invention are described with reference to the drawings.

Figure 1:
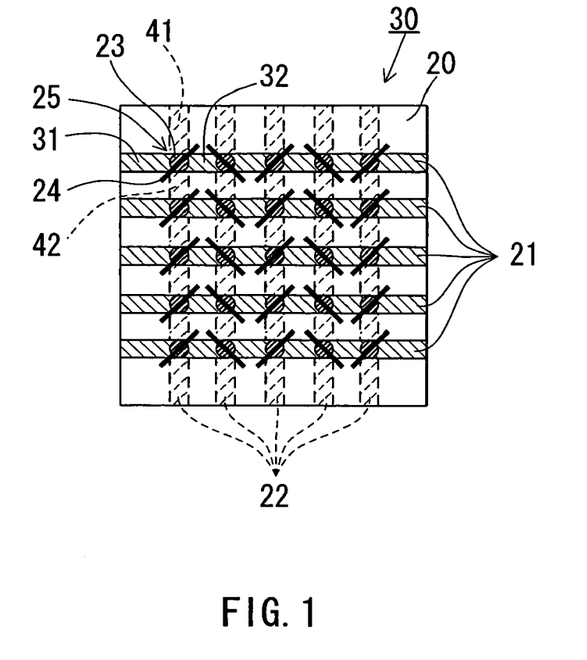
FIG. 1 is a plan view illustrating one embodiment of a thermoelectric conversion element according to the present invention.

FIG. 1 illustrates one embodiment of a thermoelectric conversion element according to the present invention. In a thermoelectric conversion element 30, p-type thermoelectric conversion parts 31, 32, . . . are arranged on a surface (first surface) of an insulating layer (substrate) 20 in such a manner as to shape a striped pattern, and n-type thermoelectric conversion part 41, 42, . . . are arranged on a back surface (second surface) of the insulating layer 20 in such a manner as to shape a striped pattern. The stripes composed of the p-type thermoelectric conversion parts 31, 32, . . . (striped p-type thermoelectric conversion parts 21) and the stripes composed of n-type thermoelectric conversion parts 41, 42, . . . (striped p-type thermoelectric conversion parts 22) intersect with each other, forming overlapping portions 25. In each of the overlapping portions 25, an electrode (inner electrode) 23 is arranged that serves as a conducting portion within the insulating layer. In this embodiment, both of the stripes 21 composed of the p-type thermoelectric conversion parts 31, 32, . . . and the stripes 22 composed of the n-type thermoelectric conversion parts 41, 42, . . . are arranged in the form of stripes that shape straight lines, in other words, in the form of rectilinear stripes.

Each of the inner electrodes 23 is cut apart into two pieces at a cutting line 24. The cutting line 24 also cuts apart the stripes 21 (22) composed of p-type (n-type) thermoelectric conversion parts. Thus, the striped pattern composed of the p-type (n-type) thermoelectric conversion parts is formed of the stripes 21 (22) cut apart at the overlapping portions 25, not of continuous stripes.

Figure 2:
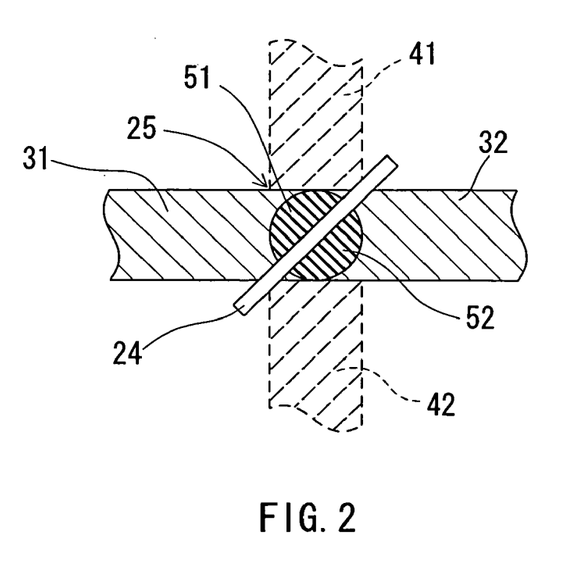
FIG. 2 is a partially-enlarged view of FIG. 1.

As illustrated in FIG. 2, in each of the overlapping portions 25, the inner electrode 23 is cut apart into a first inner electrode (first conducting portion) 51 and a second inner electrode (second conducting portion) 52, the striped p-type thermoelectric conversion part 21 is cut apart into a first p-type thermoelectric conversion part 31 and a second p-type thermoelectric conversion part 32, and the striped n-type thermoelectric conversion part 22 is cut apart into a first n-type thermoelectric conversion part 41 and a second n-type thermoelectric conversion part 42, all of them at a cutting line 24.

The first inner electrode (first conducting portion) 51 electrically connects the first p-type thermoelectric conversion part 31 and the first n-type thermoelectric conversion part 41, the second inner electrode (second conducting portion) 52 electrically connects the second p-type thermoelectric conversion part 32 and the second n-type thermoelectric conversion part 42, and the two inner electrodes 51 and 52 are electrically isolated from each other. Thus, two electrical junctions are formed at each of the overlapping portions 25 of the thermoelectric conversion element 30.

It should be noted that although the inner electrode 23 has been illustrated herein as a conducting portion, the conducting portion may be a contact between the p-type thermoelectric conversion parts 31, 32 and the n-type thermoelectric conversion part 41, 42 within the insulating layer 20. For the formation of a conducting portion, the insulating layer 20 has an inner electrode 23 or a through-hole, preferably the inner electrode 23, within the interior thereof. The cutting line 24 is normally a void created by the later-described laser processing, but an insulative material may be filled into the void.

Figure 3:
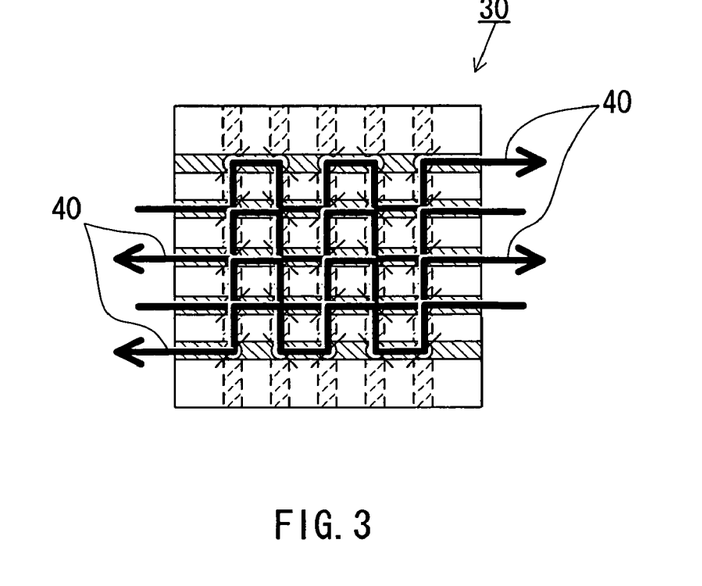
FIG. 3 is a plan view illustrating an example of a mode of use of the thermoelectric conversion element shown in FIG. 1.

FIG. 3 shows an example of the mode of use of the thermoelectric conversion element 30. The thermoelectric conversion element 30 is supplied with a dc current 40 from an external power supply, which is not shown in the figure, so that the current flows either from the p-type thermoelectric conversion part to the n-type thermoelectric conversion part, or in the opposite direction through both of the two electrical junctions existing in each one of the overlapping portions. In this way, both the two electrical junctions existing in each one of the overlapping portions become either heat-generating portions or heat-absorbing portions.

Figure 4:
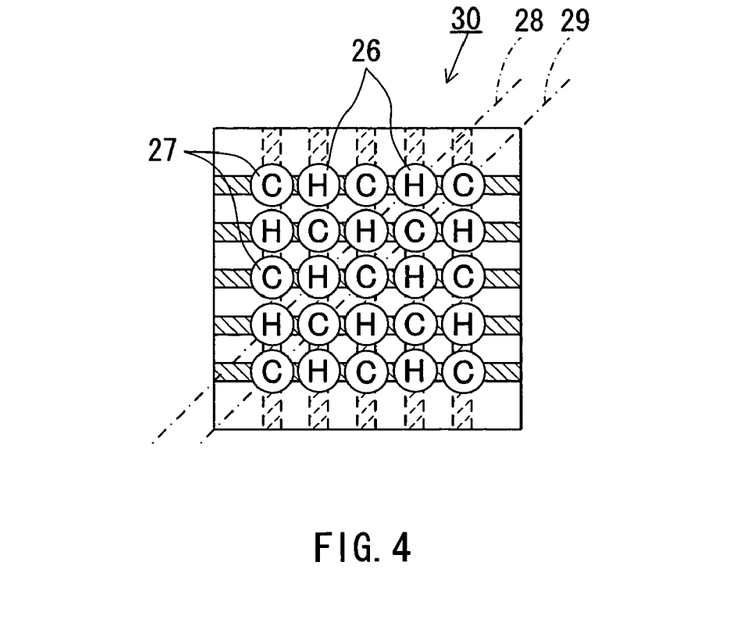
FIG. 4 is a view illustrating a heat-generating portion H (hot spot) and a heat-absorbing portion C (cold spot) formed by the mode of use shown in FIG. 3.

As a consequence, as illustrated in FIG. 4, heat-generating portions (H) 26 and heat-absorbing portions (C) 27 alternately form at every other overlapping portion, both lengthwise and widthwise, in the thermoelectric conversion element 30. When the direction of the current 40 is reversed, the heat-generating portions 26 and the heat-absorbing portions 27 accordingly change from one to the other. This means that heat generation or heat absorption is effected by two pn junctions per each one of the heat-generating portions 26 and the heat-absorbing portions 27. This makes it possible to obtain two times the efficiency of the conventional thin film-type element (cf. FIG. 18). Thus, according to the present invention, the area that does not contribute to the device operation can be reduced in comparison with the conventional elements.

For conducting heat absorption from outside or heat dissipation to outside efficiently, it is advisable that a first heat conducting member (heat-dissipating member) that is in contact with the heat-generating portions 26 be arranged on one surface while a second heat conducting member (heat-absorbing member) that is contact with the heat-absorbing portions 27 be arranged on the other surface. The heat conducting members must be arranged so that each of them is in contact with one of the heat-generating portions 26 and the heat-absorbing portions 27 but not in contact with the other one. For example, it is recommended that the contact between the heat-dissipating member and the thermoelectric conversion element 30 be made along a line 28 while the contact between the heat-absorbing member and the thermoelectric conversion element 30 be made along a line 29, respectively.

In the thermoelectric conversion element 30 shown in FIGS. 1 through 4, two or more overlapping portions 25 include heat-generating overlapping portions 26 and heat-absorbing overlapping portions 27 when the dc current 40 is passed through the striped p-type thermoelectric conversion parts 21 and the striped n-type thermoelectric conversion parts 22, and the heat-generating overlapping portions 26 and the heat-absorbing overlapping portions 27 are respectively arranged on straight lines 28 and 29, within an in-plane direction of the insulating layer 20. Therefore, it is easy to bring the overlapping portions having a thermal characteristic of the same type into contact with a heat conducting member.

Figure 5:
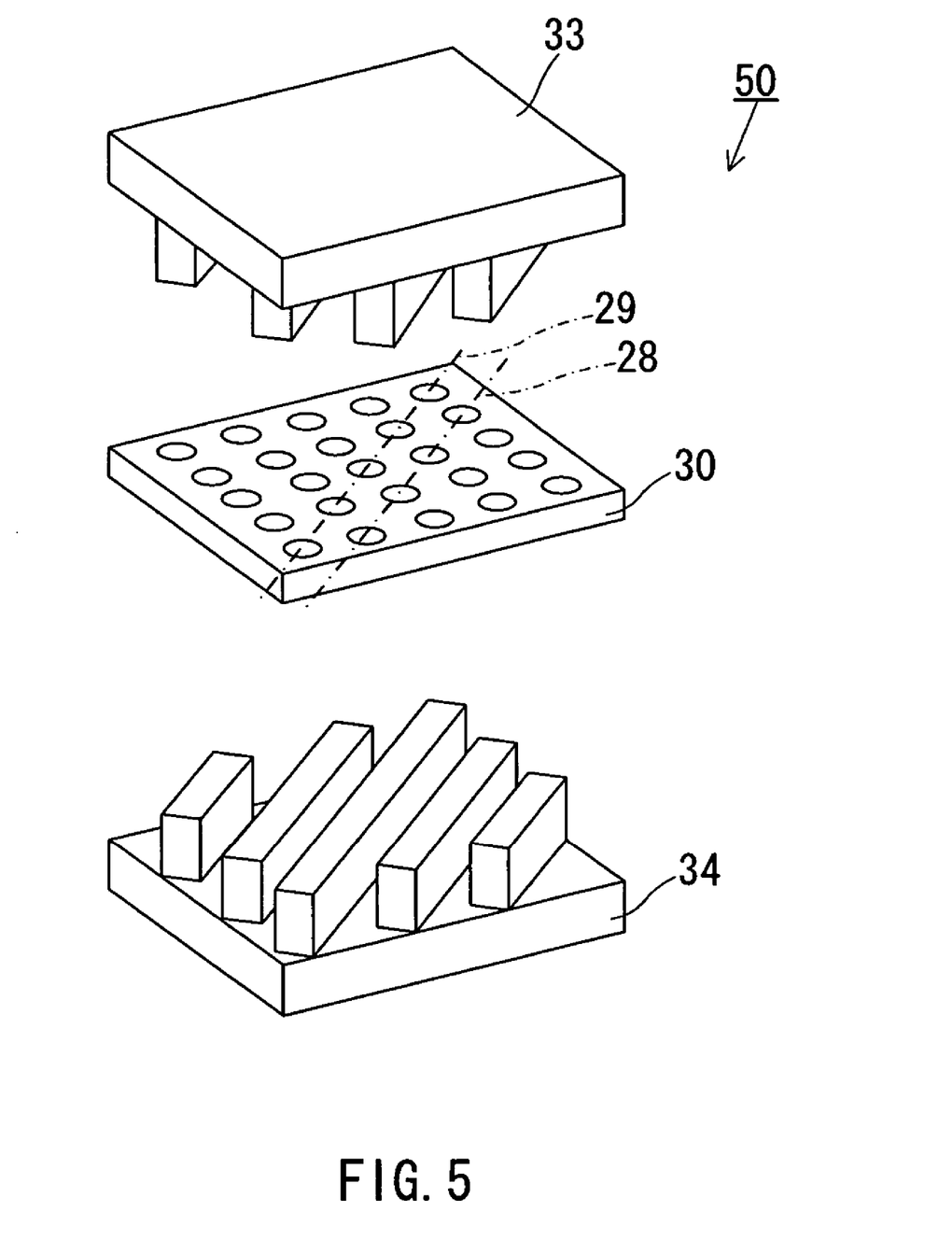
FIG. 5 is an exploded perspective view illustrating a thermoelectric conversion device according to one embodiment of the present invention.
Figure 6:
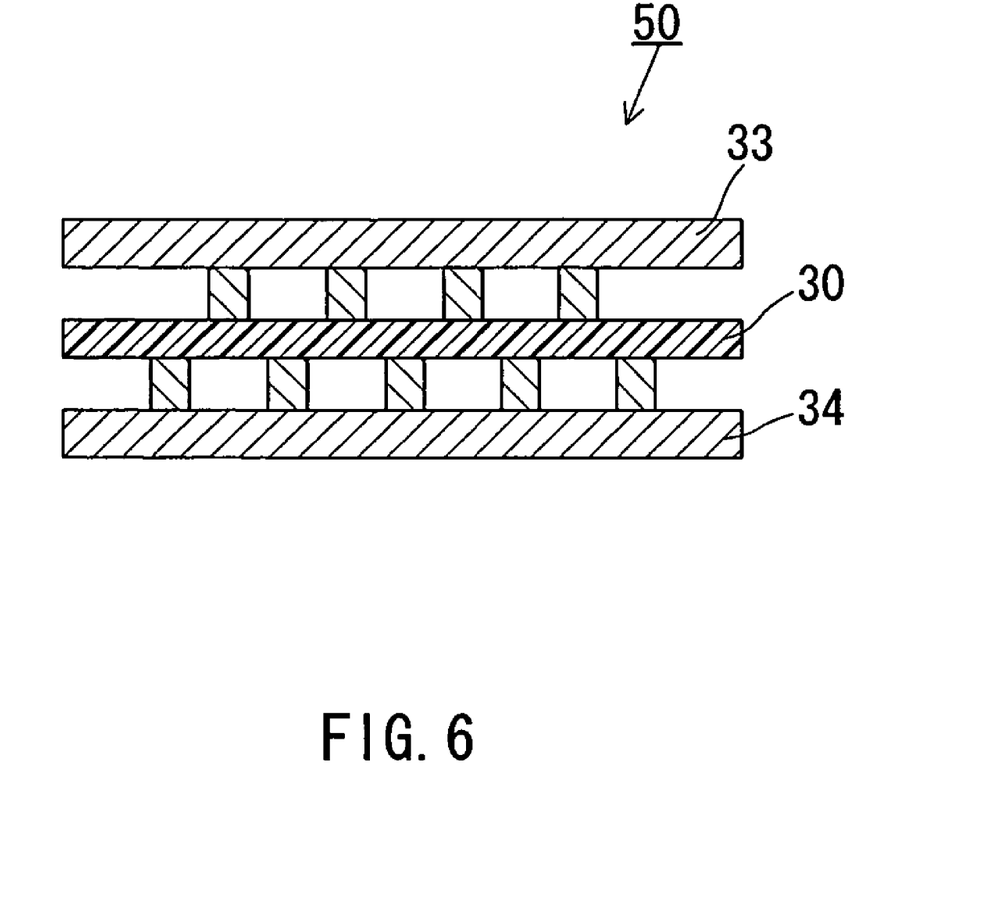
FIG. 6 is a cross-sectional view of the thermoelectric conversion device shown in FIG. 5.

FIGS. 5 and 6 illustrate one embodiment of a thermoelectric conversion device provided with heat conducting members (heat bath fins). In this thermoelectric conversion device 50, projections of a heat-dissipating member 33 are arranged along the line 28 so as to be in contact only with the heat-generating portions 26, while projections of a heat-absorbing member 34 are arranged along the line 29 so as to be in contact only with the heat-absorbing portions 27. It should be noted that although in FIG. 5, plate-shaped projections that protrude from the two heat conducting members 33 and 34 are arranged in parallel to each other, these projections are not limited to having this configuration but may be arranged so as to intersect with each other at right angles.

When current is passed through the thermoelectric conversion device 50, heat absorption can be effected by the heat-absorbing member 34. Heat is radiated from the heat-dissipating member 33. When a temperature difference is produced between the two heat conducting members 33 and 34, the thermoelectric conversion device 50 can be used as a thermal power generation apparatus.

Thus, it is desirable that the thermoelectric conversion device of the present invention is furnished with, as its heat conducting members, the first heat conducting member 33 being in contact with the first surface and the second heat conducting member 34 being in contact with the second surface. Specifically, it is desirable that the thermoelectric conversion device be furnished with a first heat conducting member 33 that is thermally in contact with a portion selected from the overlapping portions 25 in the first surface of the thermoelectric conversion element 30 (i.e., heat-generating portions 26), and a second heat conducting member 34 that is thermally in contact with at least a portion of the overlapping portions 25 that is selected from those excluding the foregoing portion (heat-generating portions 26) in the second surface (i.e., heat-absorbing portions 27). Here, the phrase "being thermally in contact" means any form of contact by which heat transfer is possible, and is not limited to the form of physical direct contact.

Materials having good thermal conductive properties, such as electrically insulative materials including sapphire, alumina, aluminum nitride, diamond, boron nitride, and silicon carbide, are suitable for the heat conducting members 33 and 34; but conductive materials such as metallic materials and carbon materials may be partially contained therein as long as the electrical insulation at the joining part with the thermoelectric conversion element can be ensured.

Hereinbelow, one embodiment of the manufacturing method according to the present invention is described with reference to the drawings.

Figure 7:
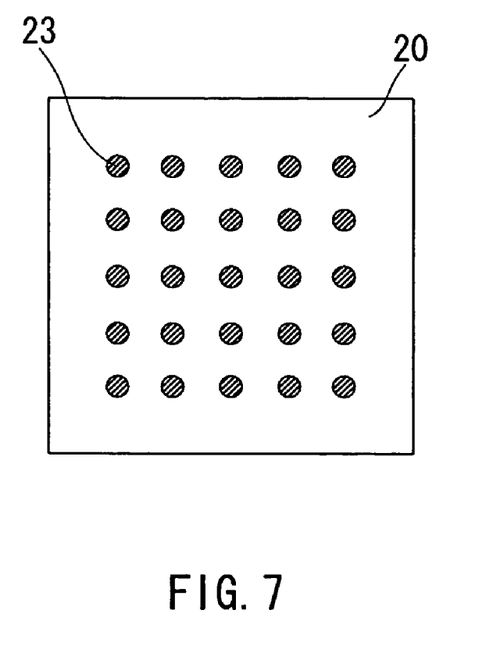
FIG. 7 is a plan view an insulating layer used in a manufacturing method according to the present invention.

First, as illustrated in FIG. 7, an insulating layer (substrate) 20 in which inner electrodes 23 have been buried in advance as the conducting portions is prepared. The inner electrodes 23 pierce through the insulating layer 20 and ensure electrical conduction across two surfaces of this layer 20. In this embodiment, the inner electrodes 23 are arranged spaced at a predetermined gap apart lengthwise and widthwise of the insulating layer 20, although the form of the arrangement is not limited to this. In place of the inner electrodes 23, through-holes may be formed as the conducting portions within the insulating layer. The p-type (n-type) thermoelectric conversion material film fills into the through-holes, forming pn junctions in the through-holes. The conducting portions may be the inner electrodes 23 or contacts between the p-type thermoelectric conversion parts and the n-type thermoelectric conversion parts in the insulating layer 20, but preferably the inner electrodes 23.

The insulating layer 20 needs to have electrically insulative properties and is preferable to have good thermally insulative properties. Specifically, resin, ceramic, laminated wood, paper plate, or the like may be used. It is preferable that the insulating layer 20 have flexibility, so an insulating layer made of resin is desirable in this respect. When using an insulating layer having flexibility, a flexible thermoelectric conversion element can be obtained. When a flexible heat conducting member is used in combination, a flexible thermoelectric conversion device can be obtained. The flexible thermoelectric conversion device makes possible, for example, human body heat power generation with clothing.

Figure 8:
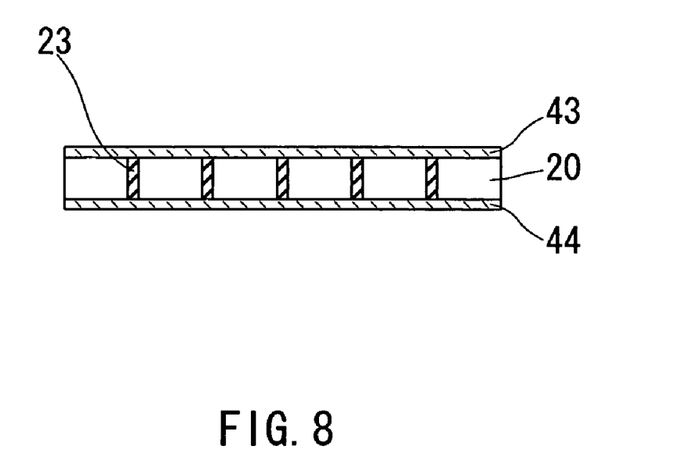
FIG. 8 is a cross-sectional view for illustrating a manufacturing step for a thermoelectric conversion element using the insulating layer shown in FIG. 7.

Next, as illustrated in FIG. 8, a p-type thermoelectric conversion material film 43 is formed on one surface of the insulating layer 20 and an n-type thermoelectric conversion material film 44 is formed on the other surface thereof. Preferable examples of the thermoelectric conversion material include semiconductor materials such as Bi—Te, Pb—Te, and Si—Ge, as well as oxide materials such as $NaCoO_2$. The method of forming the films is not particularly limited, and an appropriate method may be selected from a coating decomposition method, a sol-gel method, a vapor deposition method, a sputtering method, and the like, according to the type of the material and the like.

Figure 9:
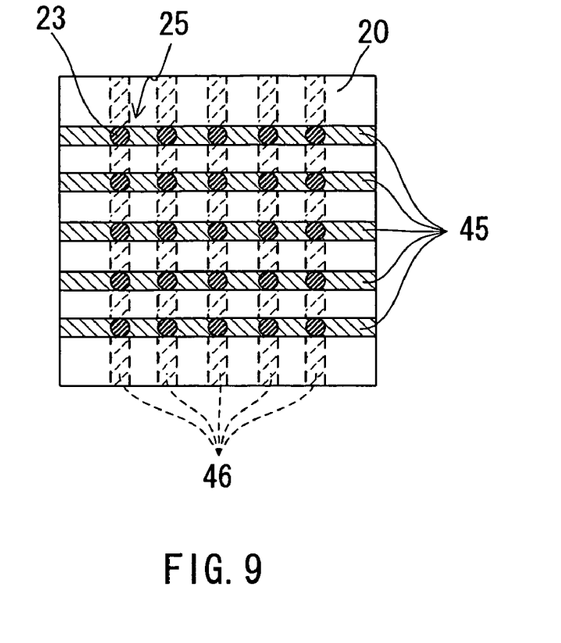
FIG. 9 is a plan view illustrating a manufacturing step that follows the manufacturing step shown in FIG. 8.

Further, as illustrated in FIG. 9, the p-type thermoelectric conversion material film 43 is divided so as to shape a striped pattern, and thereby continuous stripes (p-type stripes) 45 formed of p-type thermoelectric conversion parts are formed. Likewise, the n-type thermoelectric conversion material film 44 is divided so as to shape a striped pattern, and thereby continuous stripes (n-type stripes) 46 formed of n-type thermoelectric conversion parts are formed. These thermoelectric conversion material films 43 and 44 are divided so that the p-type stripes 45 and the n-type stripes 46 intersect to form overlapping portions 25 within the regions at which the inner electrodes 23 are arranged. The dividing of the films may be carried out by, for example, mechanical cutting processing, etching processing, or laser processing. In this embodiment, both the p-type and n-type stripes 45 and 46 are rectilinear stripes and therefore the dividing of the film can be performed very easily.

Subsequently, the inner electrodes 23, the p-type stripes 45, and the n-type stripes 46 are cut apart at the overlapping portions 25, at which the stripes intersect, and thus, the thermoelectric conversion element shown in FIG. 1 is obtained. As explained above, this cutting is carried out so that two electrical junctions electrically isolated from each other are formed within each of the overlapping portions. By this cutting process, the current paths in the thermoelectric conversion element are determined, and the p-type stripes 45 and the n-type stripes 46 are formed into respective stripes 21 and 22 that are cut apart at intermediate points. The cutting to be performed in this step can be carried out easily when laser light is used.

In order to obtain the element shown in FIG. 1 from the element shown in FIG. 9, it is necessary to cut apart the conducting portions 23 together with the p-type stripes 45 and the n-type stripes 46 so that the first conducting portions (first inner electrodes) 51 and the second conducting portions (second inner electrodes) 52 are formed from the conducting portions (inner electrodes) 23. In contrast, when the first conducting portions and the second conducting portions are disposed in advance, in other words, when two types of conducting portions that have been cut apart in advance are disposed within the insulating layer as the conducting portions, as in a later-described Example, it is unnecessary to cut apart the conducting portions together with the p-type and n-type stripes.

The foregoing has described a method in which the p-type thermoelectric conversion material film 43 and the n-type thermoelectric conversion material film 44 are formed first and thereafter the films are divided. This method includes the steps of (a) producing a layered material in which a p-type thermoelectric conversion material film 43, an insulating layer 20, and an n-type thermoelectric conversion material film 44 are disposed in that order with respect to the thickness direction, and the p-type thermoelectric conversion material film 43 and the n-type thermoelectric conversion material film 44 are electrically connected via a conducting portion 23 arranged within the insulating layer 20; (b) dividing the p-type thermoelectric conversion material film 43 so as to shape a striped pattern, to form p-type stripes 45; and (c) dividing the n-type thermoelectric conversion material film 44 so as to shape a striped pattern, to form n-type stripes 46.

Figure 10:
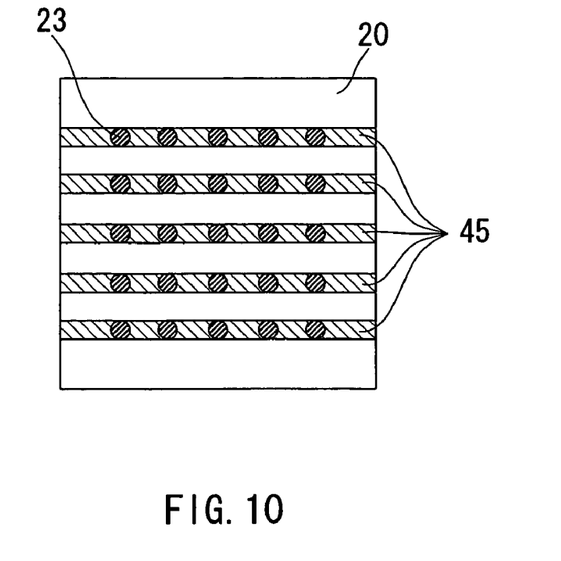
FIG. 10 is a plan view for illustrating another manufacturing step in the manufacturing method according to the present invention.

These steps (a) to (c) are not always essential in the manufacturing method of the present invention, however. For example, it is also possible that, as illustrated in FIG. 10, one of the films (for example, the p-type thermoelectric conversion material film 43) is formed on the insulating layer 20 shown in FIG. 8, and the resultant film is divided to form one type of stripes (p-type stripes 45) before forming the other film (the n-type thermoelectric conversion material film 44).

Furthermore, the p-type stripes 45 and the n-type stripes 46 may be directly formed by a film deposition using a mask, without dividing the films. The forming method for the films 43 and 44 and the stripes 45 and 46 is not limited to various types of vapor depositions; a molten material or a material dissolved in a solvent may be applied and then solidified or dried, or a solid material may be bonded.

In either case of forming the p-type thermoelectric conversion material film 43 and the n-type thermoelectric conversion material film 44 and thereafter dividing the films 43 and 44, or directly depositing the p-type stripe 45 and the n-type stripe 46, the present invention does not require a complicated film-dividing process or a film-formation process accompanying complicated masking.

In a thermoelectric conversion element, an insulating layer desirable for use is not always a suitable substrate for growing a film having good crystallinity. In particular, the substrate having flexibility and being excellent in thermal insulative properties, for example, a resin layer, usually shows inferior heat resistance and therefore is not suitable for forming a thermoelectric conversion material film having good crystallinity. To obtain a thermoelectric conversion material film having good crystallinity irrespective of the types of insulating layers, it is advisable to transfer a thermoelectric conversion material deposited on a growth substrate having been prepared separately onto a working substrate that is to be used as the insulating layer of the element.

In the case of using this method, the manufacturing method of the present invention further include a step of obtaining at least one selected from the p-type stripes and the n-type stripes by transferring the p-type thermoelectric conversion material film or the n-type thermoelectric conversion material film from a substrate (growth substrate) to the insulating layer (working substrate) and dividing the p-type thermoelectric conversion material film or the n-type thermoelectric conversion material film. It is preferable that this manufacturing method be implemented as a method including the foregoing steps (a) to (c), in which the step (a) includes a step of transferring the p-type thermoelectric conversion material film or the n-type thermoelectric conversion material film that has been grown on a growth substrate from the top of the growth substrate to the top of the insulating layer (working substrate).

Hereinbelow, an example of the manufacturing method that uses a growth substrate is described with reference to the drawings.

Figure 11:
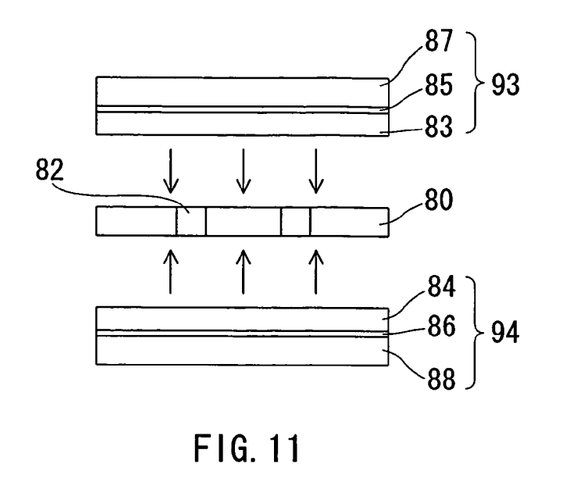
FIG. 11 is a cross-sectional view for illustrating one manufacturing step of a manufacturing method using a growth substrate.

First, as illustrated in FIG. 11, a p-type unit 93 is prepared by forming an undercoating film 85 on a growth substrate 87 and further forming a p-type thermoelectric conversion material film 83 thereon, and an n-type unit 94 is also prepared by forming an undercoating film 86 on a growth substrate 88 and further forming an n-type thermoelectric conversion material film 84 thereon. Then, with the p-type unit 93 and the n-type unit 94, an insulating layer (working substrate) 80 in which inner electrodes 82 have been buried in advance is sandwiched so that the thermoelectric conversion material films 83 and 84 are brought into contact with the insulating layer 80. Although the material for the growth substrates 87 and 88 is not particularly limited as long as it can grow films with good crystallinity, crystallized materials of inorganic substances, such as sapphire, garnet, and magnesium oxide, are preferable.

Next, the insulating layer 80 and the thermoelectric conversion material films 83 and 84 are separated from the growth substrates 87 and 88. For this separation, it is recommended that the films be taken apart in the interior of the undercoating films 85, 86 or at the interfaces between the undercoating films 85, 86 and the growth substrates 87, 88, or at the interfaces between the undercoating films 85, 86 and the thermoelectric conversion material films 83, 84. Alternatively, the undercoating films 85 and 86 may be dissolved using an appropriate solvent.

The growth substrates 87 and 88 may be eliminated rather than separated. The elimination of the growth substrates 87 and 88 can be carried out by, for example, applying laser light from the back surface of the growth substrate, or by dissolving the growth substrates 87 and 88 using a solvent capable of dissolving the growth substrates 87 and 88.

Figure 12:
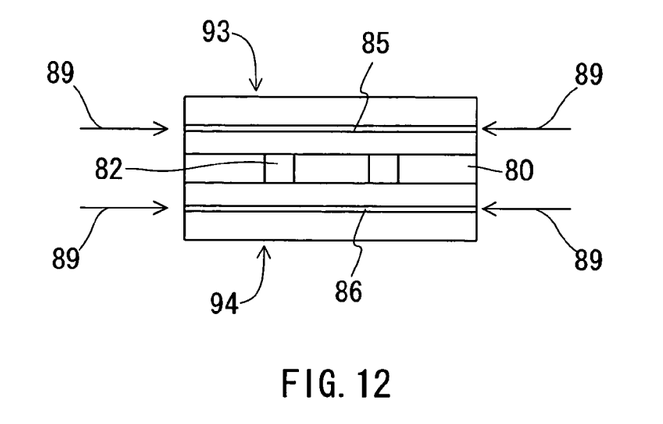
FIG. 12 is a cross-sectional view for illustrating a manufacturing step that follows the manufacturing step shown in FIG. 11.
Figure 13:
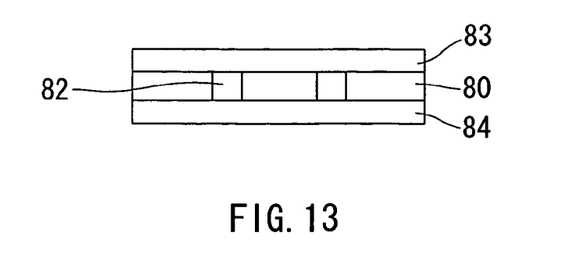
FIG. 13 is a cross-sectional view illustrating an insulating layer with a film that is obtained by the manufacturing step shown in FIG. 12.

The films can be easily taken apart by exposing the undercoating films 85 and 86, made of an oxide containing an alkali metal element, to water vapor in a state where the insulating layer 80 is sandwiched between the p-type unit 93 and the n-type unit 94, as illustrated in FIG. 12, so as to cause water molecules 89 to enter the undercoating films 85 and 86. In this way, good-quality thermoelectric conversion material films 83 and 84 with minimized damages can be obtained by forming an undercoating film that is an oxide layer containing an alkali element on a growth substrate, then growing a p-type thermoelectric conversion material film or an n-type thermoelectric conversion material film on the undercoating film, and separating the p-type thermoelectric conversion material film or the n-type thermoelectric conversion material film from the growth substrate by supplying water vapor to the undercoating film (see FIG. 13). With this method, it is recommended that the unit containing the undercoating film that is arranged in a hermetically sealed chamber be supplied with water vapor from a water vapor source, for example, from water in the chamber to the undercoating film.

As the oxide containing an alkali metal element, a layered oxide having a composition represented by the formula $A_xCoO_2$ is particularly preferable. In the formula, A is at least one alkali metal element, M is at least one element selected from Co, Fe, Ni, Mn, Ti, Cr, V, Nb, and Mo, x is a numerical value within a range of 0<x<1. Hereinbelow, the compounds shown in the following Examples also have the same range of x.

The use of the growth substrates 87 and 88 are not essential in the manufacturing method of the present invention, and it is possible to form the thermoelectric conversion material film directly on the substrate of the device element. In this case, it is preferable that a metal that can be easily deposited, such as bismuth, antimony, lead, tin, and tellurium, or an alloy thereof be used as the thermoelectric conversion material.

Hereinbelow, the present invention is further detailed with reference to Examples thereof.

In the following Examples, a configuration that is different from the configuration shown in FIGS. 1 through 4 is employed, in which the stripes composed of p-type thermoelectric conversion parts and the stripes composed of n-type thermoelectric conversion parts are curved. This configuration is advantageous in thermally connecting heat-generating portions or heat-absorbing portions together while maintaining a distance between the heat-generating portions and the heat-absorbing portions. As clearly seen from FIGS. 2 and 4, the adjacent overlapping portions to a predetermined overlapping portion 25 of a heat-generating portion 26 or a heat-absorbing portion 27 become heat-absorbing portions 27 (or heat-generating portions 26) that have the opposite thermal characteristic. P-type thermoelectric conversion parts 31 and 32, or n-type thermoelectric conversion parts 41 and 42 connects the overlapping portions 25 that have opposite thermal characteristic. In other words, the overlapping portions that are closest to a predetermined overlapping portion are the overlapping portions that have the opposite thermal characteristic (opposite-characteristic overlapping portions). In view of this, by designing the shape and arrangement of the p-type and n-type stripes ideally, it is possible that the predetermined overlapping portion can have an overlapping portion that has the same thermal characteristic at a location closer than where the opposite-characteristic overlapping portions are. The configuration in which the overlapping portions having the same thermal characteristic are arranged in close proximity to each other is advantageous in reducing heat loss.

As described above, in the present invention, at least one selected from the p-type stripes and the n-type stripes may be formed into curved stripes, or at least one selected from the stripes formed of the p-type thermoelectric conversion parts or the stripes formed of the n-type thermoelectric conversion parts may be formed into curved stripes. Herein, the term "curved stripes" is intended to include such stripes only a portion of which is curved. In addition, for the reason stated above, it is preferable that, taking heat loss into consideration, a predetermined overlapping portion 25 have an overlapping portion disposed at a location closer than the adjacent overlapping portion that has the first p-type thermoelectric conversion part 31, the second p-type thermoelectric conversion part 32, the first n-type thermoelectric conversion part 41, or the second n-type thermoelectric conversion part 42, interposed therebetween.

Figure 14:
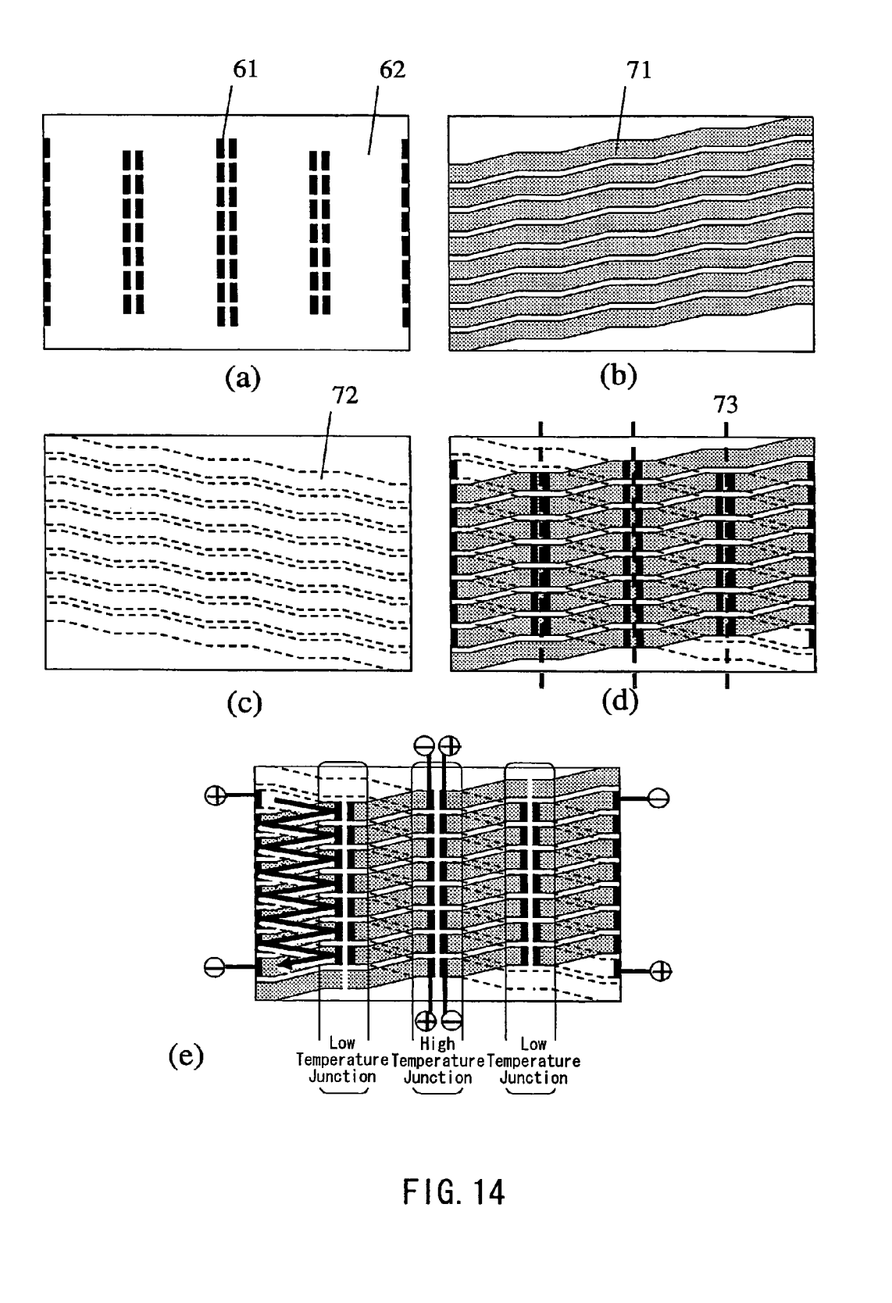
FIG. 14A is a plan view of an insulating layer.
FIG. 14B is a plan view illustrating a pattern of p-type stripes.
FIG. 14C is a plan view illustrating a pattern of n-type stripes.
FIG. 14D is a plan view for illustrating cutting lines by laser light.
FIG. 14E is a plan view illustrating a mode of use of the thermoelectric conversion element obtained.

Specifically, it is desirable that, as illustrated in FIG. 14E, two or more overlapping portions include heat-generating overlapping portions and heat-absorbing overlapping portions when a dc current is passed through the striped p-type thermoelectric conversion parts and the striped n-type thermoelectric conversion parts, and the heat-generating overlapping portions and the heat-absorbing overlapping portions are arranged so that the distance between the heat-generating overlapping portions and the distance between the heat-absorbing overlapping portions are set to be less than the distance between the overlapping portions that become the heat-generating portions and the overlapping portions that become the heat-absorbing portions.

EXAMPLE 1

The present example employed a p-type crystalline thermoelectric conversion material $Ca_xCoO_2$ and an n-type crystalline thermoelectric conversion material $LaNiO_3$. First, a $Na_xCoO_2$ undercoating film having a layered bronze structure was formed on a c-plane sapphire substrate to have a thickness of 50 nm, and on the undercoating film, a $Ca_xCoO_2$ film or a $LaNiO_3$ film was deposited to a thickness of 500 nm. The films were formed by sputtering at a growth temperature of 700° C. using sintered compact targets of respective materials. For the growth atmosphere, 10% oxygen-mixed argon gas was adjusted at 1 Pa, and the sputtering discharge power was set at 80 W. It was confirmed by X-ray diffraction that under these growth conditions, the respective oxide films were epitaxially grown with a uniform crystal orientation. With these conditions, the undercoating film $Na_xCoO_2$ was grown with the c axis oriented perpendicularly on the sapphire c-plane, and thereafter, the $Ca_xCoO_2$ film subsequently was grown with its c axis oriented perpendicularly, while the (111) plane of the $LaNiO_3$ film was grown on the undercoating film.

Next, the $Ca_xCoO_2$ film and the $LaNiO_3$ film were brought into contact with respective surfaces of a 1 mm thick resin substrate in which metallic internal electrodes were buried at locations spaced apart from each other, and they were set aside for 30 hours in a hermetically sealed container in which water vapor is contained (temperature: 45° C., relative humidity: 100%). Water molecules penetrated into the $Na_xCoO_2$ film, causing strain thereto, and thereby, the $Ca_xCoO_2$ film and the $LaNiO_3$ film were separated from the sapphire substrate. Thus, an element in which a p-type and an n-type thermoelectric conversion material films were formed on respective surfaces of the resin substrate was obtained.

It should be noted that it is also possible to use the $Na_xCoO_2$ film itself as a thermoelectric conversion material. When this is the case, it is unnecessary to provide the intervening undercoating films. Furthermore, even when a substrate material other than sapphire is used, a fabricating method similar to the foregoing can be performed as long as an oxide containing an alkali metal element, such as $Na_xCoO_2$, can be formed with a good crystal orientation on the substrate material. Moreover, when the thermoelectric conversion material films are taken off and thereafter bonded onto a resin substrate or the like, the same result can be attained.

FIG. 14A is a plan view of a resin substrate 62 in which metallic electrodes 61 are buried. In the present example, the metallic electrodes 61 that had been divided into two pieces in advance were buried. In this way, the metallic electrodes 61 are not necessarily divided together with the stripes composed of a thermoelectric conversion material but may be divided in advance.

As described above, after forming a p-type and an n-type thermoelectric conversion material films on respective surfaces of the resin substrate 62, these films were divided by laser processing to obtain p-type stripes 71 and n-type stripes 72. The patterns of these stripes are respectively shown in FIGS. 14B and 14C. The width of the stripes 71 and 72 was 5 mm, and the gap was 0.5 mm. The p-type and the n-type stripes 71 and 72 were formed so that they intersect with each other at the regions in which the inner electrodes were buried.

Subsequently, the p-type stripe 71 and the n-type stripe 72 were cut apart by laser processing at overlapping portions at which these stripes intersect with each other. The laser processing was conducted so that the laser was applied along cutting lines 73 that were set so as to transverse a plurality of overlapping portions (FIG. 14D).

An external dc power supply was connected to the thermoelectric conversion element thus obtained, and a current of 1 mA was supplied thereto. As a result, a temperature difference of 20° C. was produced between the high-temperature junction and the low-temperature junction (FIG. 14E).

In this thermoelectric conversion element, each of the high-temperature junctions and the low-temperature junctions is aligned in one line in order to thermally connect the junctions of the same type easily. Moreover, it is designed in such a manner that the gap between the junctions of the same type adjacent to each other is shorter than the gap between the junctions of different types adjacent to each other, so that heat loss can be reduced.

EXAMPLE 2

In the present example, a thermoelectric conversion material film produced by solution coating decomposition was used in order to manufacture a relatively large-area thermoelectric conversion element.

A source material solution was prepared by mixing ethylene glycol with a citric acid solution in which sodium acetate and cobalt acetate were dissolved, and the prepared source material solution was sprayed at 450° C. onto a 10 cm-square c-plane sapphire substrate, followed by a heat treatment in oxygen at 700° C.; thus, a $Na_xCoO_2$ undercoating film having a thickness of 200 nm was formed. Likewise, using solutions in which acetates were dissolved, a $Ca_3Co_4O_9$ film was grown as a p-type thermoelectric conversion material film and an aluminum-doped ZnO film was grown as an n-type thermoelectric conversion material film to a thickness of 5000 nm by repeatedly conducting applying solutions and drying. Subsequently, the $Ca_3Co_4O_9$ film and the ZnO film were heat-treated at 850° C. and 650° C., respectively. As a result, thick films with good crystallinity, in which the c axis of the films was uniformly aligned, were formed. Although acetates were used as the source materials herein, the source materials are not limited thereto. The subsequent process was carried out in the same manner as in Example 1, and a thermoelectric conversion element was thus fabricated.

Figure 15:
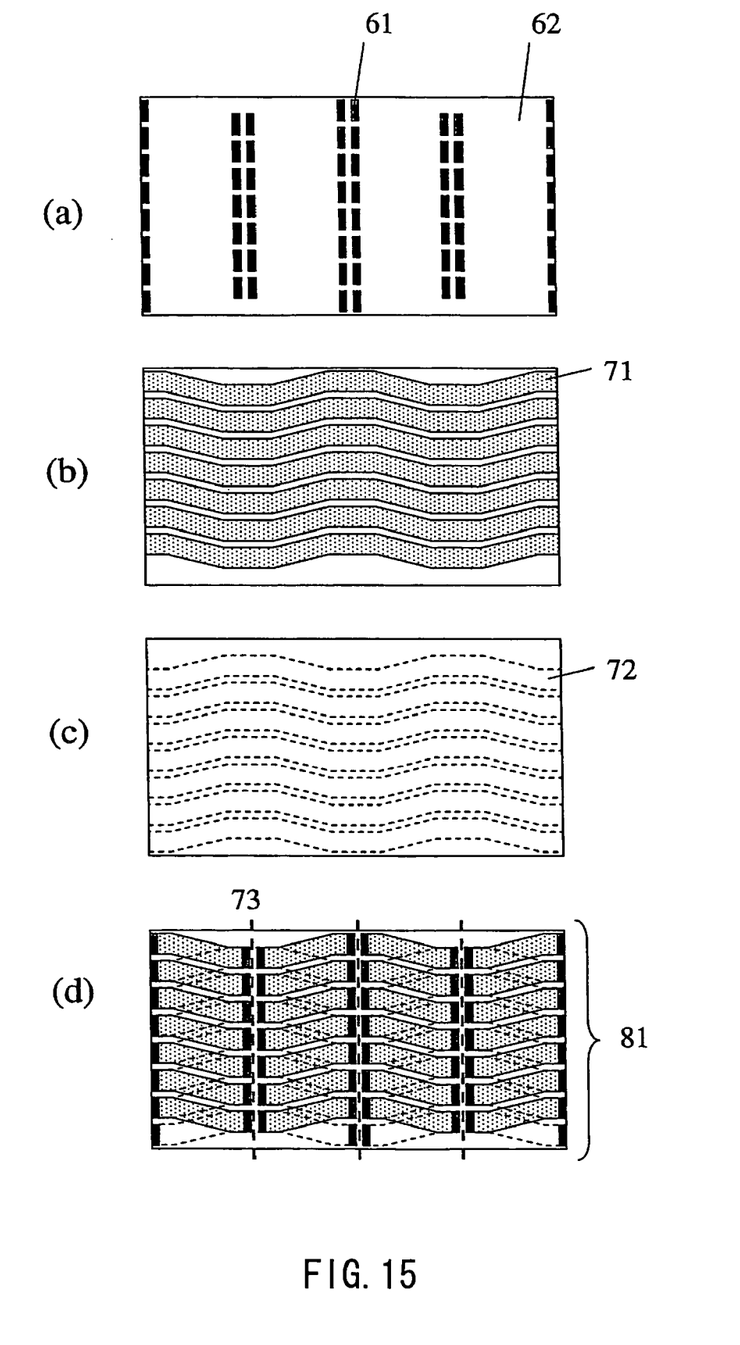
FIG. 15A is a plan view of an insulating layer.
FIG. 15B is a plan view illustrating a pattern of p-type stripes.
FIG. 15C is a plan view illustrating a pattern of n-type stripes.
FIG. 15D is a plan view for illustrating cutting lines by laser light.

The present example also used, as illustrated in FIG. 15A, a resin substrate 61 in which pre-divided inner electrodes 62 were arranged, and p-type stripes 71 and n-type stripes 72 were formed as illustrated in FIGS. 15B and 15C. The p-type and the n-type stripes 71 and 72 were cut apart along cutting lines 73 as shown in FIG. 15D, and a thermoelectric conversion element 81 was thus obtained. With this pattern, the extending directions of the p-type stripes 71 and the n-type stripes 72 agree with each other on both surfaces of the substrate 61, and therefore, it is easy to determine the pattern.

Figure 16:
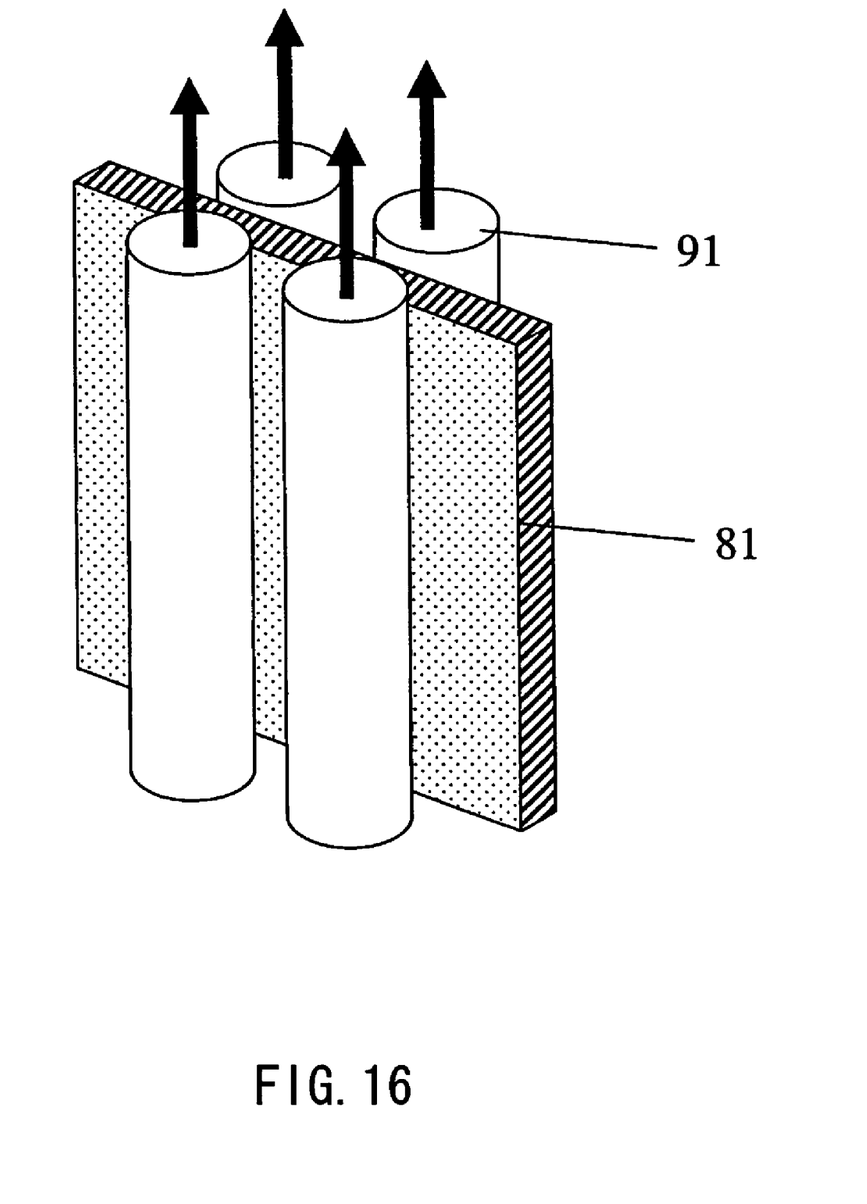
FIG. 16 is a perspective view illustrating a thermoelectric conversion device fabricated according to Example 2.

Using the thermoelectric conversion element 81, a thermoelectric conversion device shown in FIG. 16 was fabricated. In this thermoelectric conversion device, heat pipes 91 were arranged so as to be thermally in contact with one of the junction arrays of the thermoelectric conversion element 81. A combustion exhaust gas was supplied through the heat pipes in the direction indicated by the arrows and kept at about 200° C., and the other one of the junction arrays was air-cooled with a fan so that a temperature difference of 150° C. was maintained between the junction arrays. With 10 sets of this device, the effective element area was made 1000 $cm^2$, and an electromotive force of 5 V was obtained.

According to the present invention, it is possible to provide a thermoelectric conversion element with high efficiency even when the thickness is reduced. The present invention is remarkably useful as it provides an unprecedentedly thin and flexible high-performance electronic cooling device and, for example, a thermal power generation apparatus that makes available a wearable power supply utilizing human body heat. The present invention also makes it possible to manufacture a thin-type thermoelectric conversion element efficiently.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A thermoelectric conversion element comprising: an insulating layer, striped p-type thermoelectric conversion parts arranged on a first surface of the insulating layer, and striped n-type thermoelectric conversion parts arranged on a second surface of the insulating layer wherein said second surface is opposite said first surface; and
   the thermoelectric conversion element having overlapping portions at which the striped p-type thermoelectric conversion parts and the striped n-type thermoelectric conversion parts intersect when viewed along a thickness direction of the insulating layer;
   wherein, at one or more of the overlapping portions,
   a) a first p-type thermoelectric conversion part of the striped p-type thermoelectric conversion parts and a first n-type thermoelectric conversion part of the striped n-type thermoelectric conversion parts are electrically connected via a first conducting portion arranged within the insulating layer;
   b) a second p-type thermoelectric conversion part of the striped p-type thermoelectric conversion parts and a second n-type thermoelectric conversion part of the striped n-type thermoelectric conversion parts are electrically connected via a second conducting portion arranged within the insulating layer;
   c) the first p-type thermoelectric conversion part and the second p-type thermoelectric conversion part are adjacent to each other with the overlapping portion interposed therebetween and are cut apart from each other in the overlapping portion;
   d) the first n-type thermoelectric conversion part and the second n-type thermoelectric conversion part are adjacent to each other with the overlapping portion interposed therebetween and are cut apart from each other in the overlapping portion; and
   e) the first conducting portion and the second conducting portion are electrically isolated.

2. The thermoelectric conversion element according to claim 1, wherein the same conditions as a) through e) are satisfied at two or more of the overlapping portions.

3. The thermoelectric conversion element according to claim 1, wherein:
   the first conducting portion is an electrode, or a contact between the first p-type thermoelectric conversion part and the first n-type thermoelectric conversion part within the insulating layer; and
   the second conducting portion is an electrode, or a contact between the second p-type thermoelectric conversion part and the second n-type thermoelectric conversion part within the insulating layer.

4. The thermoelectric conversion element according to claim 3, wherein the first conducting portion and the second conducting portion are electrodes.

5. The thermoelectric conversion element according to claim 1, wherein the striped p-type thermoelectric conversion parts and the striped n-type thermoelectric conversion parts form rectilinear stripes.

6. The thermoelectric conversion element according to claim 1, wherein at least one selected from the striped p-type thermoelectric conversion parts and the striped n-type thermoelectric conversion parts forms curved stripes.

7. The thermoelectric conversion element according to claim 2, wherein the two or more overlapping portions include heat-generating overlapping portions and heat-absorbing overlapping portions when a dc current is passed through the striped p-type thermoelectric conversion parts and the striped n-type thermoelectric conversion parts, and the heat-generating overlapping portions and the heat-absorbing overlapping portions are arranged in respective straight lines.

8. The thermoelectric conversion element according to claim 2, wherein the two or more overlapping portions include heat-generating overlapping portions and heat-absorbing overlapping portions when a dc current is passed through the striped p-type thermoelectric conversion parts and the striped n-type thermoelectric conversion parts, and the heat-generating overlapping portions and the heat-absorbing overlapping portions are arranged so that the distance between the heat-generating overlapping portions and the distance between the heat-absorbing overlapping portions are set to be less than the distance between the heat-generating overlapping portions and the heat-absorbing overlapping portions.

9. The thermoelectric conversion element according to claim 1, wherein the insulating layer has flexibility.

10. The thermoelectric conversion element according to claim 1, wherein the insulating layer is made of resin.

11. A thermoelectric conversion device comprising a thermoelectric conversion element according to claim 1 and a heat conducting member being in contact with a portion of the overlapping portions in the first surface or in the second surface.

12. The thermoelectric conversion device according to claim 11, wherein the heat conducting member comprises a first heat conducting member being in contact with the first surface and a second heat conducting member being in contact with the second surface.

13. A method of manufacturing a thermoelectric conversion element, comprising:
   producing a layered material in which p-type stripes composed of a p-type thermoelectric conversion material, an insulating layer, and n-type stripes composed of an n-type thermoelectric conversion material are arranged in that order when viewed along a thickness direction of the insulating layer; the p-type stripes and the n-type stripes intersect with each other to form overlapping portions; and the p-type stripes and the n-type stripes are electrically connected at the overlapping portions via conducting portions provided within the insulating layer; and
   forming p-type thermoelectric conversion parts and n-type thermoelectric conversion parts by cutting apart the p-type stripes and the n-type stripes;

wherein the p-type stripes and the n-type stripes are cut apart at one or more of the overlapped portions in such a manner that:

f) a first p-type thermoelectric conversion part and a second p-type thermoelectric conversion part that are cut apart from each other are formed from the p-type stripes;

g) a first n-type thermoelectric conversion parts and a second n-type thermoelectric conversion parts that are cut apart from each other are formed from the n-type stripes;

h) the first p-type thermoelectric conversion part and the first n-type thermoelectric conversion part are electrically connected via a first conducting portion that is arranged within the insulating layer as one of the conducting portions; and i) the second p-type thermoelectric conversion part and the second n-type thermoelectric conversion part are electrically connected via a second conducting portion that is arranged within the insulating layer as one of the conducting portions and is electrically isolated from the first conducting portion.

14. The method of manufacturing a thermoelectric conversion element according to claim 13, wherein the conducting portions as well as the p-type stripes and the n-type stripes are cut apart so that the first conducting portion and the second conducting portion are formed from the conducting portions.

15. The method of manufacturing a thermoelectric conversion element according to claim 13, wherein the first conducting portion and the second conducting portion are arranged within the insulating layer in advance.

16. The method of manufacturing a thermoelectric conversion element according to claim 13, wherein the conducting portions are electrodes, or contacts between the p-type stripes and the n-type stripes within the insulating layer.

17. The method of manufacturing a thermoelectric conversion element according to claim 13, wherein the conducting portions are electrodes.

18. The method of manufacturing a thermoelectric conversion element according to claim 13, wherein the step of producing a layered material comprises:

(a) producing a layered material in which the p-type thermoelectric conversion material film, the insulating layer, and the n-type thermoelectric conversion material film are arranged in that order with respect to the thickness direction, and the p-type thermoelectric conversion material film and the n-type thermoelectric conversion material film are electrically connected via conducting portions arranged within the insulating layer;

(b) dividing the p-type thermoelectric conversion material film so as to shape a striped pattern, to form p-type stripes; and (c) dividing the n-type thermoelectric conversion material film so as to shape a striped pattern, to form n-type stripes.

19. The method of manufacturing a thermoelectric conversion element according to claim 18, wherein the step (a) comprises transferring the p-type thermoelectric conversion material film or the n-type thermoelectric conversion material film that has been grown on a substrate from the top of the substrate to the top of the insulating layer.

20. The method of manufacturing a thermoelectric conversion element according to claim 19, the step (a) further comprising: forming an undercoating film that is an oxide layer containing an alkali element on the substrate, growing the p-type thermoelectric conversion material film or the n-type thermoelectric conversion material film on the undercoating film, and separating the p-type thermoelectric conversion material film or the n-type thermoelectric conversion material film from the substrate by supplying water vapor to the undercoating film.

21. The method of manufacturing a thermoelectric conversion element according to claim 19, wherein the substrate is a crystallized material of an inorganic substance.

22. The method of manufacturing a thermoelectric conversion element according to claim 19, wherein the insulating layer is made of resin.

23. The method of manufacturing a thermoelectric conversion element according to claim 13, further comprising a step of obtaining at least one selected from the p-type stripes and the n-type stripes, by transferring the p-type thermoelectric conversion material film or the n-type thermoelectric conversion material film that has been grown on a substrate from the top of the substrate to the top of the insulating layer and dividing the p-type thermoelectric conversion material film or the n-type thermoelectric conversion material film.

24. The method of manufacturing a thermoelectric conversion element according to claim 13, wherein the p-type stripes and the n-type stripes are formed into rectilinear stripes.

25. The method of manufacturing a thermoelectric conversion element according to claim 13, wherein at least one selected from the p-type stripes and the n-type stripes is formed into curved stripes.

26. The method of manufacturing a thermoelectric conversion element according to claim 13, wherein the insulating layer has flexibility.

27. The method of manufacturing a thermoelectric conversion element according to claim 13, wherein the insulating layer is made of resin.

* * * * *